(12) United States Patent
Seebacher et al.

(10) Patent No.: US 10,171,039 B2
(45) Date of Patent: Jan. 1, 2019

(54) DEVICES AND METHODS THAT FACILITATE POWER AMPLIFIER OFF STATE PERFORMANCE

(71) Applicant: Infineon Technologies AG, Neubiberg (DE)

(72) Inventors: David Seebacher, Villach (AT); Christian Schuberth, Villach-Landskron (AT); Peter Singerl, Villach (AT); Tim Canning, Regensburg (DE); Richard Wilson, Morgan Hill, CA (US); Haedong Jang, San Jose, CA (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/840,963

(22) Filed: Aug. 31, 2015

(65) Prior Publication Data
US 2017/0063308 A1    Mar. 2, 2017

(51) Int. Cl.
| H03F 3/68 | (2006.01) |
| H03F 1/02 | (2006.01) |
| H03F 1/56 | (2006.01) |
| H03F 3/193 | (2006.01) |
| H03F 3/21 | (2006.01) |
| H03F 3/72 | (2006.01) |

(52) U.S. Cl.
CPC ......... *H03F 1/0277* (2013.01); *H03F 1/0288* (2013.01); *H03F 1/56* (2013.01); *H03F 3/193* (2013.01); *H03F 3/211* (2013.01); *H03F 3/72* (2013.01); *H03F 2200/318* (2013.01); *H03F 2200/451* (2013.01); *H03F 2203/7233* (2013.01)

(58) Field of Classification Search
CPC ...................................................... H03F 1/0277
USPC .............................................. 330/124 R, 295
See application file for complete search history.

(56) References Cited

U.S. PATENT DOCUMENTS

| 5,420,541 | A |   | 5/1995 | Upton et al. |   |
|---|---|---|---|---|---|
| 6,085,074 | A | * | 7/2000 | Cygan | H03F 1/0288 330/295 |
| 6,603,351 | B2 | * | 8/2003 | Suzuki | H03F 1/3205 330/133 |
| 7,078,976 | B2 |   | 7/2006 | Blednov |   |
| 7,714,663 | B2 | * | 5/2010 | Gong | H03F 1/223 330/310 |
| 8,653,889 | B1 | * | 2/2014 | Acimovic | H03F 1/0288 330/124 R |

(Continued)

*Primary Examiner* — Khanh V Nguyen
*Assistant Examiner* — Khiem Nguyen
(74) *Attorney, Agent, or Firm* — Eschweiler & Potashnik, LLC

(57) ABSTRACT

A peaking amplifier is disclosed. The peaking amplifier includes a driver stage, a final stage, and an interstage matching network. The driver stage has a load impedance and is configured to generate a driver output based on an input signal. The final stage has a final stage input impedance and is configured to generate a peaking output based on the driver output. The interstage matching network is coupled to the driver stage and the final stage. The interstage matching network is configured to transform the final stage input impedance to the load impedance for the driver stage when the peaking amplifier is ON and to provide a short to an input of the final stage when the peaking amplifier is in an OFF state.

20 Claims, 6 Drawing Sheets

(56) References Cited

U.S. PATENT DOCUMENTS

| | | | |
|---|---|---|---|
| 8,666,338 B2 * | 3/2014 | Zhao | H03F 1/0277 330/124 R |
| 2005/0156670 A1 * | 7/2005 | Rategh | H03F 1/483 330/295 |
| 2013/0190036 A1 | 7/2013 | Zhao | |

* cited by examiner

DEVICES AND METHODS THAT FACILITATE POWER AMPLIFIER OFF STATE PERFORMANCE

BACKGROUND

Communication systems often use transmission signals focused around a carrier frequency of a defined channel. Information is conveyed by representing the information with a modulation based on amplitude, phase, frequency and/or combinations thereof. The information is sent by one or more signals over a band of frequencies around the carrier frequency.

A radio frequency (RF) power amplifier is often used for modulations, such as amplitude modulation. The RF power amplifier is required to operate over wide ranges of frequencies and power levels.

Some important characteristics for power amplifiers include power efficiency and gain. The power efficiency is important in order to reduce power consumption. The higher the power efficiency, the less power consumed. Gain represents the amount of amplification of an input signal to an output signal. A higher gain generates a higher amplitude version of the input signal as the output signal of the power amplifier.

DETAILED DESCRIPTION

Figure 1:
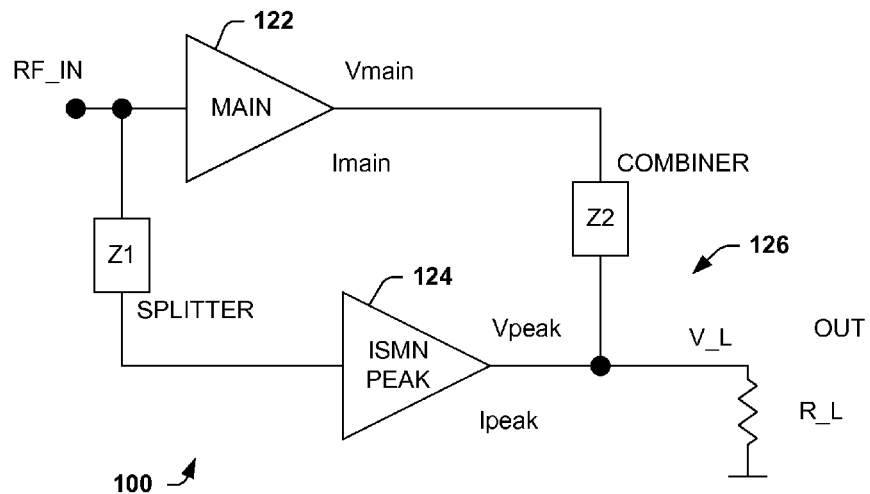
FIG. 1 is a diagram illustrating a multilevel power amplifier arrangement.

The present invention will now be described with reference to the attached drawing figures, wherein like reference numerals are used to refer to like elements throughout, and wherein the illustrated structures and devices are not necessarily drawn to scale.

Systems, methods, devices and embodiments are provided that utilize an interstage matching network (ISMN) between driver stages of a peaking amplifier. The interstage matching network permits a higher gate biasing of a final power amplifier stage, which facilitates higher gain and reduces power consumption.

A multi-stage power amplifier architecture or arrangement is an architecture where two or more amplifiers are combined or connected to allow high efficiency operation at lower output powers. Even with a small input signal, an amplifier that is ON consumes substantial power. However, power consumption can be reduced by turning OFF one or more of the amplifier during low output power situations. An example of a low power situation is one where the input signal for the arrangement is relatively small and less than all of the amplifier stages are needed to supply the output signal.

Further power reduction is obtained by turning OFF the one or more amplifiers that are not needed. However, even when OFF, these amplifiers typically have parasitic capacitances, inductances, resistances and the like. These parasitic characteristics can lead to a feedback effect at their gate by injecting an unwanted voltage swing at the gate node. The unwanted gate voltage can lead to RF current conduction of the amplifier stage transistor causing an undefined impedance at the drain of the amplifier stage transistor. In addition, the undefined feedback leads to undesired DC power consumption.

One technique to mitigate the undefined impedance and DC power consumption is to bias the gate of the amplifier stage transistor below a threshold voltage. However, this technique reduces gain of the amplifier stage.

FIG. 1 is a diagram illustrating a multilevel power amplifier arrangement 100. The power amplifier arrangement 100 receives an RF input signal and generates an amplified output signal OUT from the RF input signal. The output signal matches the shape of the input signal but has a larger amplitude. The arrangement 100 generates the output signal with relatively high power efficiency and a selected gain. The power amplifier arrangement 100 is a multi-stage amplifier arrangement. The arrangement 100 is shown with two stages for illustrative purposes, however it is appreciated that more than two stages can be used.

The multilevel arrangement 100 includes a main power amplifier 122 and an ISMN peaking power amplifier 124. The main amplifier 122 and the peaking power amplifier 124 operate in parallel. The main amplifier 122 is ON throughout an operating power range. The peaking amplifier 124 is only ON when the RF_IN is at an amplitude or power above or equal to a first level or threshold level, also referred to as peaking. Thus, the level or amplitude of the input signal determines whether the peaking amplifier 124 is ON or OFF. The peaking amplifier 124, in one example, is configured to turn ON when the amplitude of the input signal exceeds the first level by setting a bias voltage for the peaking amplifier 124. It is appreciated that other techniques can be used to control whether the peaking amplifier 124 is ON or OFF.

A splitter Z1 splits or directs the input signal to both the main amplifier 122 and the peaking amplifier 124. In one example, the splitter Z1 divides the input signal by 90 degrees or ¼ the signal wavelength and provides the divided input signal to the peaking amplifier 124. A combiner Z2 is configured to combine outputs of the main amplifier 122 and the peaking amplifier 124 into the output signal OUT. In one example, the combiner Z2 divides the output of the main amplifier 122 by 90 degrees or ¼ the signal wavelength and combines the divided output signal with the output of the peaking amplifier 124.

The main amplifier 122 includes at least one transistor and is typically a class AB, linear amplifier. As stated above, the main amplifier 122 is on throughout the operating power range of the arrangement 100. The output of the main amplifier 122 includes a voltage Vmain and a current Imain.

The ISMN peaking amplifier 124 includes a plurality of transistors or stages and an interstage matching network. The peaking amplifier 124 is a class C, non-linear amplifier and supplements the main amplifier 122 when the level of the input signal reaches or exceeds the first level (peaking). The output of the peaking amplifier 124 includes a voltage Vpeaking and a current Ipeaking. The interstage matching network can be a device, circuitry, and the like.

The output signal is combined from the outputs of the peaking amplifier 124 and the main amplifier 122. The output signal has a load current and load voltage (V_L). The output signal is applied to a load represented by R_L.

The efficiency of the arrangement 100 is defined as an output power of the output signal divided by an input power, essentially the power supplied to the main amplifier 122 and the peaking amplifier 124. The gain of the arrangement 100 is the amplitude of the output signal divided by the amplitude of the input signal. The gain is generally linear.

The peaking amplifier 124 consumes little to no power when OFF and provides an open circuit at its output, unlike other approaches. The interstage matching network mitigates power consumption in the OFF state by causing a short to ground to an input of a final or output stage of the amplifier 124. As a result, the final stage is OFF and its output provides the open circuit. Thus, the insterstage matching network facilitates the efficiency of the arrangement 100 the feedback effect is avoided or mitigated.

The interstage matching network of the peaking amplifier 124 facilitates OFF state behavior for the arrangement 100 and other multilevel amplifiers. It is appreciated that the interstage matching network and/or the peaking amplifier 124 can be used in other amplifier arrangements that have portions switched ON and OFF.

Figure 2:
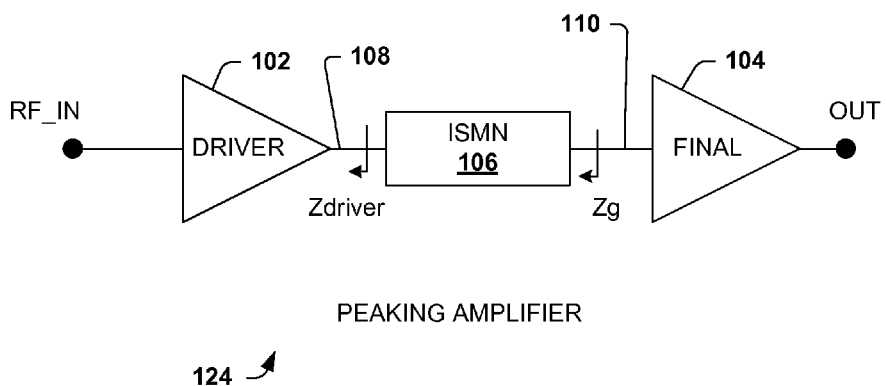
FIG. 2 is a diagram illustrating a peaking amplifier.

FIG. 2 is a diagram illustrating a peaking amplifier 124. The peaking amplifier 124 is used in a multilevel amplifier, such as the arrangement 100 shown above.

The amplifier 124 generates the output signal with relatively high power efficiency and a selected gain. The amplifier 124 utilizes a matching network that mitigates the feedback effect, permits a higher gate biasing of a final stage, permits higher gain, less power and the like.

The peaking amplifier 124 is a multi-stage amplifier arrangement. The amplifier 124 is shown with two stages for illustrative purposes, however it is appreciated that more than two stages can be used.

The peaking amplifier 124 includes a driver amplifier stage 102, an interstage matching network 106 and a final amplifier stage 104. The driver amplifier stage 102 provides first or driver power and has a load impedance Zdriver. The final amplifier stage 106 provides final stage power and has a final stage impedance Zg. The driver amplifier stage 102 and the final amplifier stage 104 include transistors having a gate, source and drain.

In operation, the amplifier 124 generates an output signal (OUT) based on and amplified from an input signal (RF_IN). The power or amplitude level of the output signal is based on the power or amplitude level of the input signal. The amplifier 124 is OFF for input power levels of zero to a first input level of the input signal. The amplifier 124 is ON or peaking for input power levels at or above the first input level. In one example, the first input level is 0.5 volts, however it is appreciated that other values can be used for the first input level.

The driver power of the driver stage 102 provides a driver output signal based on the input signal. The ISMN 106 receives the driver output signal and provides an ISMN output. The final stage 104 receives the ISMN output and generates the final stage output signal.

When the amplifier 124 is OFF, the final stage 104 presents substantially an open circuit at its output.

The interstage matching network 106 is coupled between the driver amplifier stage 102 and the final amplifier stage 104. The ISMN 106 receives a driver stage output signal 108 and provides the ISMN output signal, also referred to as the final stage input signal 110. The interstage matching network 106 generally matches an input impedance Zg of the final stage 104 to the required load impedance Zdriver of the driver stage 102.

The ISMN 106 is designed in such a way that when the driver 102 is switched OFF it provides an short circuit to the gate or input of the final stage 104. This short circuit prevents any voltage on the gate of the final stage 104 and thus mitigates/reduces the feedback effect. Thus, the ISMN 106 is configured and/or designed based on the driver stage 102 and the final stage 104, without using or requiring an output matching network for the driver 102 or a separate input matching network for the final stage.

In one example, the ISMN 106 is comprised of circuitry or circuit components, such as resistors, inductors, capacitors and the like. The circuitry is typically configured to generate or transform the matching impedance when the peaking amplifier 124 is ON and provide a short circuit to the input of the final amplifier stage 104 when the final stage 104 and the driver 102 are OFF.

Figure 3:
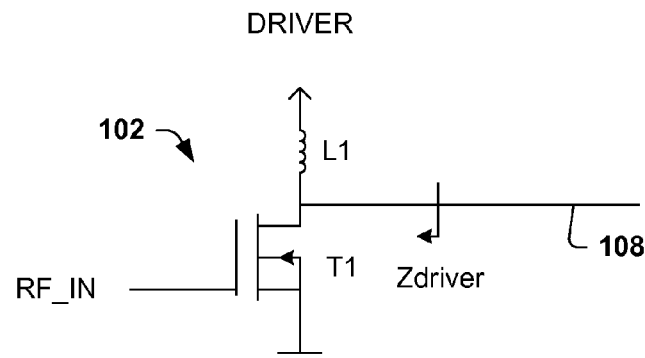
FIG. 3 is a diagram illustrating an example of a driver amplifier stage that can be used with the peaking amplifier.

FIG. 3 is a diagram illustrating an example of a driver amplifier stage 102 that can be used with the peaking amplifier 124. The driver stage 102 is shown with additional details in order to provide an example implementation and facilitate understanding. It is appreciated the driver amplifier stage 102 can be implemented with suitable variations.

The driver stage 102 receives an RF input signal, shown as RF_IN in FIG. 3 and generates a driver stage output signal 108. The output signal 108 is amplified from the input signal by a gain or gain factor greater than 1. The output signal 108 is amplified with respect to the input signal upon the input signal being at or above the first input level. Otherwise, the driver stage is OFF and consumes no power.

The driver amplifier stage 102 includes a power or driver transistor T1 and an inductor L1. The driver transistor T1 includes a gate, drain and source. The source is coupled to ground. The gate, also referred to as an input, receives the input signal RF_IN. The drain, also referred to as its output, provides the output signal 108 and is also connected to an inductor L1. The inductor L1 is connected to a supply voltage. The driver stage 102 has an impedance seen from its output shown as Zdriver.

Figure 4:
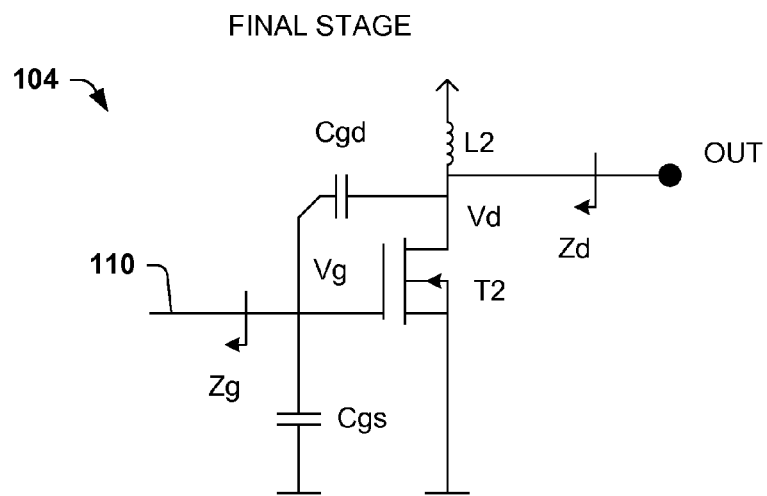
FIG. 4 is a diagram illustrating an example of a final amplifier stage that can be used with the peaking amplifier.

FIG. 4 is a diagram illustrating an example of a final amplifier stage 104 that can be used with the peaking amplifier 124. The final stage 104 is shown with additional details for illustrative purposes. It is appreciated that the final amplifier stage 104 can be implemented with suitable variations.

The final stage 104 is configured to receive an input signal 110 and generate an output signal (OUT) based on the input signal 110. The output signal is amplified from the input signal 110. Generally, the output signal is amplified at a selected gain or gain factor when the final stage 104 is in an ON state. Typically, the final stage 104 is OFF when the input signal to the driver stage 102 is at or below the first input level.

The final stage 104 includes a power or final power transistor T2 and an inductor L2. The transistor T2 includes a gate, source and drain. The transistor T2 receives the input signal at its gate, which is also referred to as the final stage input. The output signal (OUT) is generated at its drain. Its source is connected to ground. Its drain is connected to the inductor L2, which is, in turn, connected to a supply voltage, such as a 28V supply.

The final stage 104 typically includes parasitic characteristics, including parasitic capacitances. The parasitic characteristics includes a gate to drain parasitic capacitance shown as Cgd and a gate to source parasitic capacitance shown as Cgs. The output of the final stage is at a drain voltage Vd and has a drain impedance shown as Zd. There is also a impedance presented to the gate of transistor T2 shown as Zg.

In operation, there is a voltage swing present at the output/drain of the transistor T2 when the final stage 104 is OFF. The voltage swing can lead to feedback to the input/gate via the gate to drain parasitic capacitance Cgd, which is referred to as the feedback effect. The feedback at the gate can cause a feedback voltage at the gate and lead to current conduction by the transistor T2.

The ISMN 106 mitigates the feedback effect and, therefore, mitigates power consumption when the peaking amplifier 124 is OFF. In one example, the gate of the final stage transistor L2 is biased at −3.3 V with the ISMN 106 present. In another example, where the ISMN 106 is not present, the gate bias is set at −3.9 V.

Figure 5:
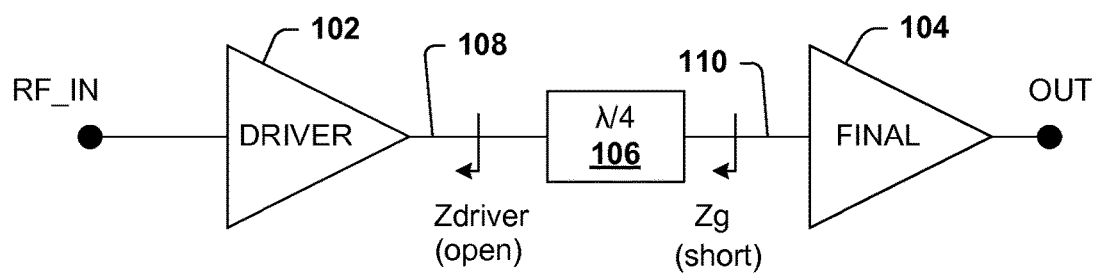
FIG. 5 is a diagram illustrating a peaking amplifier.

FIG. 5 is a diagram illustrating a peaking amplifier 124. The peaking amplifier is similar in operation to that shown in FIG. 2, but is described with an example of the ISMN 106.

The amplifier 124 includes a driver stage 102, ISMN 106 and a final stage 104. The amplifier 124 receives an input signal RF_IN and generates an output signal OUT. The output signal OUT is an amplified version of the input signal RF_IN.

The ISMN 106 is configured to mitigate the feedback effect and reduce power consumption when the peaking amplifier 124 is in the OFF state. Additionally, the ISMN 106 is configured with a topology having a quarter wave line. The quarter wave line is based on the frequency/wavelength of the input signal RF_IN. The quarter wave line provides a suitable impedance transformation when the driver 102 and the final 104 stages are ON. When the driver 102 and final 104 stages are in the OFF state, the output of the driver stage 102 is substantially an open circuit. The quarter wave line transforms an open circuit into a short circuit at the input/gate of the final driver 104, which mitigates the feedback effect.

It is appreciated that the quarter wave line is merely an example and that other topologies or configurations can be used for the ISMN 106.

Figure 6:
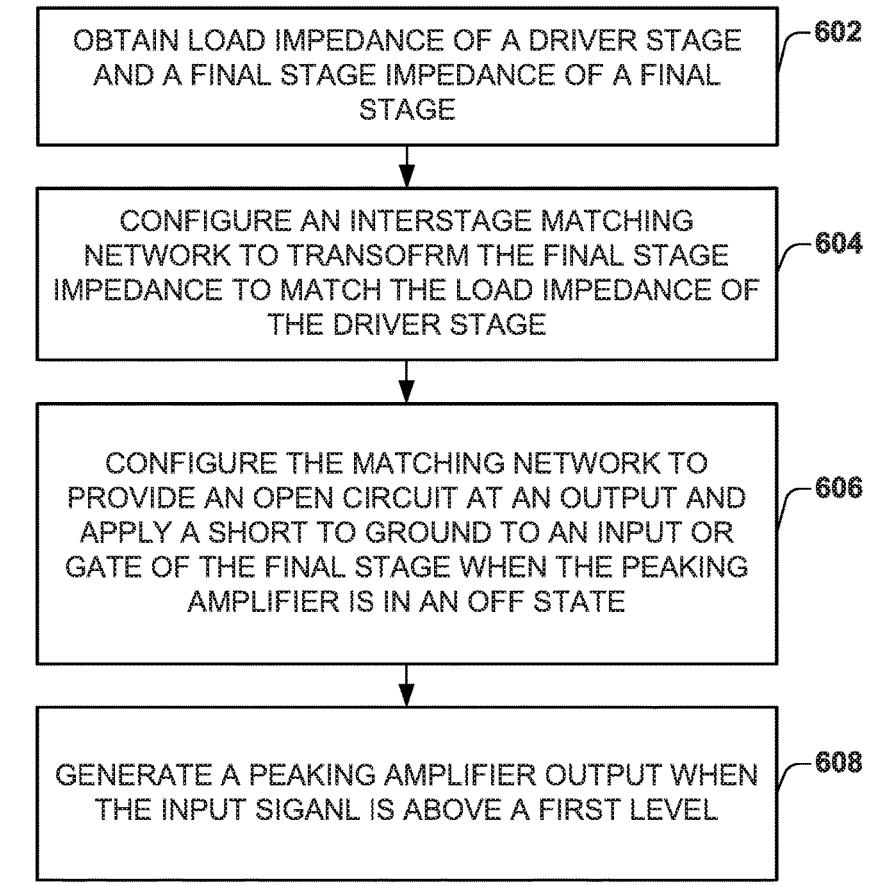
FIG. 6 is a flow diagram illustrating a method of configuring and operating a peaking amplifier.

FIG. 6 is a flow diagram illustrating a method 600 of configuring and operating a peaking amplifier. The method 600 generates a peaking amplifier output with relatively high power efficiency and a selected gain. The peaking amplifier includes a driver stage and a final stage. It is appreciated that suitable variations of the method 600 can include additional amplifier stages.

The method 600 begins at block 602 where a load impedance of a driver stage and a final stage impedance of a final stage are obtained. The driver stage is an initial stage of the peaking amplifier and has the load impedance associated with it. The final stage is coupled to or subsequent to the driver stage.

An interstage matching network is provided and configured at block 604 to transform the final stage impedance to match the load impedance of the driver stage when the peaking amplifier is in an ON state. The interstage matching network is provided between the driver stage and the final stage of the peaking amplifier. The interstage matching network transforms the final stage impedance.

The interstage matching network is configured to provide an open circuit at an output of the peaking amplifier at block 606 when the peaking amplifier is in an OFF state.

The open circuit is provided by applying a short to ground to an input or gate of the final stage of the peaking amplifier.

The peaking amplifier receives an input signal and provides a peaking amplifier output when an amplitude of the input signal is above a first level at block 608. The peaking amplifier output is based on and amplified of the received input signal. When the input signal is above the first level, the driver stage and the final stage are both ON and generate the peaking amplifier output.

Figure 7:
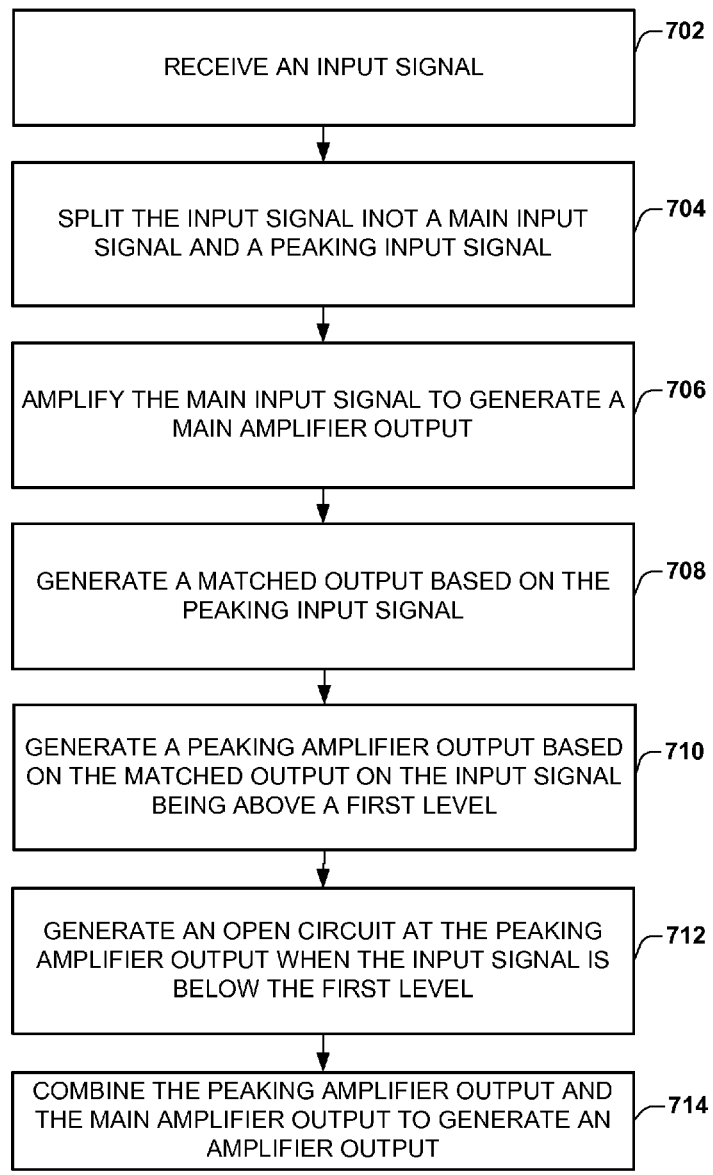
FIG. 7 is a flow diagram illustrating a method of operating a multilevel amplifier.

FIG. 7 is a flow diagram illustrating a method 700 of operating a multilevel amplifier. The method 700 generates an amplified output signal with relatively high power efficiency and a selected gain. The method uses two multiple amplifiers and deactivates or turns off one or more of the amplifiers during periods based on power levels in order to reduce power consumption. The turned off amplifiers are configured to reduce power consumption.

The method 700 can be applied for use in communication applications, modulation techniques and the like. The method 700 can be applied with the arrangement 100 described above, and/or variations thereof.

The method 700 begins at block 702 where an input signal is received. The input signal is an RF signal and has a shape and size or amplitude.

A splitter splits or directs the input signal into a main input signal and a peaking input signal at block 704. In one example the splitter provides the input signal as the main input signal without alteration and divides the input signal by a fractional wavelength to obtain the peaking input signal. The splitter includes circuitry, including resistors, inductors, capacitors and the like in order to provide the main input signal and the peaking input signal.

A main amplifier amplifies the main input signal at block 706 to generate a main amplifier output. The main amplifier is ON and active throughout a power range, which is the operating range for the multilevel amplifier. The main amplifier can be a class A or class AB type amplifier.

An interstage matching network generates a matched output at block 708 based on the peaking input signal. The interstage matching network is within a peaking amplifier, which includes a driver stage, the interstage matching network, and a final stage. The driver stage is configured to receive the peaking input signal and drive/amplify the peaking input signal.

The interstage matching network generates a matched output based on the peaking input signal and impedance matching of the driver stage and the final stage. In one example, the interstage matching network is configured to provide impedance matching for a driver stage and a final stage of the peaking amplifier. Additionally, the interstage matching network is configured to compensate or counter parasitic characteristics and impedances of the driver stage and the final stage of the peaking amplifier.

The matched output is amplified to generate a peaking amplifier output at block 710 when the amplitude of the matched output and the peaking input signal is above a first level. The peaking amplifier is turned ON when the amplitude of the input signal increases above the first level, also referred to as peaking. The ON point is set, in one example, by applying a bias voltage to the peaking amplifier. At this point, the main amplifier is unable to substantially increase the main amplifier output in response to increases in the input signal for amplitudes of the input signal above the first level.

An open circuit is generated at the peaking amplifier output at block 712 when the amplitude of the matched output and the peaking input signal is below the first level. The open circuit is generated as a result of the configuration of the interstage matching network.

Generally, the interstage matching network is configured to present a short from a gate to a drain of a power amplifier of the final stage of the peaking amplifier. As a result, the final stage of the peaking amplifier presents an open circuit as its output when the amplitude of the input signal is below the first level.

The main amplifier output and the peaking amplifier output are combined to generate an amplifier output at block 714. A combiner circuit combines the main amplifier output and the peaking amplifier output.

The combiner circuit includes one or more inductors, capacitors, resistors, and the like. In one example, the combiner circuit divides the main amplifier output by fractional wavelength, which can be the same fractional wavelength used by the splitter circuit to generate the peaking input signal.

The amplifier output is provided to a load, such as a resistive load and supplies a load voltage. The load can include communication mediums, transmitters, modulation components and the like.

While the methods above are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Figure 8:
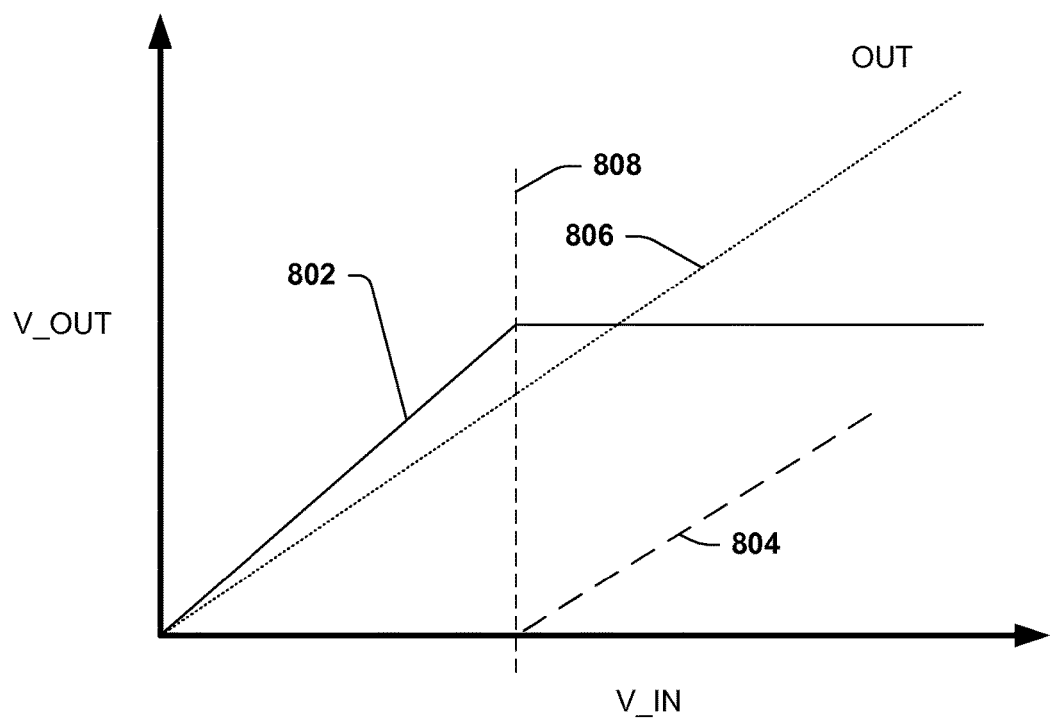
FIG. 8 is a graph illustrating operation of the multilevel power amplifier arrangement.

FIG. 8 is a graph illustrating operation of the multilevel power amplifier arrangement 100. The graph is provided as an example to facilitate understanding. It is appreciated that values and relationships shown are examples and other values and relationships can be used or result from varied implementations of the power amplifier arrangement 100.

The graph depicts an input voltage of an input signal, such as the RF_IN of FIG. 1, along an x-axis. Output voltages of output signals are shown along a y-axis.

Line 802 represents an output voltage of the main amplifier 124. It can be seen that its voltage increases linearly with an input voltage until the first input level, shown at 808. At this point, main amplifier 122 has reached its maximum voltage swing.

Line 804 represents the output current of the peaking amplifier 124. Here, it can be seen that the peaking amplifier 124 is OFF and not generating an output current until the input voltage exceeds the first input level 808. The output is offset to zero for illustrative purposes. Once the input voltage reaches or exceeds the first input level 808, the peaking amplifier 124 is turned ON and an output current increases with the input voltage.

Line 806 represents the output signal of the arrangement 100. The output signal is a combination main amplifier 122 and the peaking amplifier 124. It can be seen that the output voltage increases with regard to the input voltage across the shown input voltage range. For a first portion until the input voltage reaches the first input level 808, the output voltage is substantially based on the main amplifier 122. For a second portion after the input voltage reaches the first input level 808, the output voltage is based on a combination of the main amplifier 122 and the peaking amplifier 124.

It is appreciated that the subject matter may be implemented as a method, apparatus, or article of manufacture using standard programming and/or engineering techniques to produce software, firmware, hardware, or any combination thereof to control a computer to implement the disclosed subject matter (e.g., the systems, arrangements and the like shown in FIGS. 1, 2, etc., are non-limiting examples that may be used to implement the above methods). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

A peaking amplifier is disclosed. The peaking amplifier includes a driver stage, a final stage, and an interstage matching network. The driver stage has a load impedance and is configured to generate a driver output based on an input signal. The final stage has a final stage input impedance and is configured to generate a peaking output based on the driver output. The interstage matching network is coupled to the driver stage and the final stage. The interstage matching network is configured to transform the final stage input impedance to the load impedance for the driver stage when the peaking amplifier is ON and to provide a short to an input of the final stage when the peaking amplifier is in an OFF state.

In one example, the driver stage includes a power transistor having its gate configured to receive the input signal and its drain configured to provide the driver output.

A multilevel amplifier arrangement having a splitter circuit, a main power amplifier and a peaking amplifier is disclosed. The main power amplifier is configured to amplify the input signal through a power range and generate a main amplifier output. The peaking amplifier is configured to amplify the input signal and generate a peaking amplifier output in an ON state when the input signal has an amplitude above a first level and is in an OFF state when the amplitude is below the first level. Additionally, the peaking amplifier includes an interstage matching network configured to transform a final stage input impedance to a driver load impedance in the ON state and to provide an open circuit at an output of the peaking amplifier in the OFF state.

In one example, the power range is from about zero to a second level, where the second level is greater than the first level.

A method of operating a peaking amplifier is disclosed. A load impedance of a driver stage and a final state impedance of a final stage are identified. An interstage matching network is configured to transform the final stage impedance to match the load impedance of the driver stage when the peaking amplifier is in an ON state. The interstage matching network is configured to provide an open circuit at an output of the peaking amplifier when the peaking amplifier is in an OFF state.

In one example, the method includes receiving an input signal and providing a peaking amplifier output when an amplitude of the input signal is above a first level.

Another multilevel amplifier arrangement is disclosed. The arrangement includes a splitter circuit, a main power amplifier and a peaking amplifier. The splitter circuit is configured to provide an input signal. The main power amplifier is configured to amplify the input signal through a power range and generate a main amplifier output. The peaking amplifier has an interstage matching network and amplifies the input signal to generate a peaking amplifier output when the input signal has an amplitude above a first level and the peaking amplifier is in an OFF state when the amplitude is below the first level. The interstage matching network is configured to mitigate power consumption of the peaking amplifier in the OFF state.

A peaking amplifier is disclosed. The peaking amplifier includes a driver stage, an interstage matching network and a final stage. The driver stage is configured to generate a driver output based on an input signal. The interstage matching network is configured to transform the driver output into a matched output. The matched output provides a short circuit to the gate of the power transistor of the final stage when the peaking amplifier is in an OFF state. The final stage is configured to generate a peaking output based on the matched output.

A method of operating a multilevel amplifier is disclosed. An input signal is split to a main input signal and a peaking input signal. The main input signal is amplified through a power range to generate a main amplifier output. A matched output is generated by an interstage matching network based on the peaking input signal. The matched output is amplified to generate a peaking amplifier output when the amplitude of the matched output and the peaking input signal is above a first level. An open circuit is generated for the peaking amplifier output when the amplitude of the matched output and the peaking input signal is below the first level.

In one example, the peaking amplifier output and the main amplifier output are combined into an output signal.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A peaking amplifier comprising:
a driver stage having a load impedance and configured to generate a driver output signal based on an input signal;
a final stage having a final stage input impedance and configured to generate a peaking output signal at an output based on the driver output signal; and
an interstage matching network coupled to the driver stage and the final stage and configured to transform the final stage input impedance to the load impedance for the driver stage when the peaking amplifier is in an ON state and provide a short circuit from an output of the driver stage to an input of the final stage when the peaking amplifier is in an OFF state.

2. The peaking amplifier of claim 1, wherein the driver stage includes a power transistor having its gate configured to receive the input signal and its drain configured to provide the driver output signal.

3. The peaking amplifier of claim 1, wherein the driver stage is biased according to a first signal level of the input signal.

4. The peaking amplifier of claim 1, wherein the peaking amplifier is in the ON state when an amplitude of the input signal is above a first signal level and the peaking amplifier is in the OFF state when the amplitude of the input signal is below the first signal level, wherein the first level is greater than zero.

5. The peaking amplifier of claim 1, wherein the final stage includes a power transistor, where its drain is coupled to an inductor and a supply voltage and is configured to generate the peaking output signal.

6. The peaking amplifier of claim 5, wherein a gate of the power transistor is configured to receive an output of the interstage matching network.

7. The peaking amplifier of claim 6, wherein the final stage includes a parasitic gate to drain capacitance and a parasitic gate to source capacitance.

8. The peaking amplifier of claim 7, wherein the interstage matching network is configured to compensate the matched output based on the parasitic gate to drain capacitance and the parasitic gate to source capacitance.

9. The peaking amplifier of claim 1, wherein the interstage matching network is connected to an output of the driver stage and an input of the final stage.

10. The peaking amplifier of claim 1, wherein the final stage is configured to provide an output circuit at its output on the peaking amplifier being in an OFF state.

11. The peaking amplifier of claim 1, further comprising a combiner configured to combine the peaking output signal with a main amplifier output signal.

12. A multilevel amplifier arrangement comprising:
a splitter circuit configured to provide an input signal;
a main power amplifier configured to amplify the input signal through a power range and generate a main amplifier output signal; and
a peaking amplifier configured to amplify the input signal and generate a peaking amplifier output in an ON state when the input signal has an amplitude above a first signal level and provide an open circuit in an OFF state when the amplitude is below the first signal level, the peaking amplifier having:
a driver stage, a final stage and an interstage matching network configured to transform a final stage input impedance to a driver load impedance in the ON state and provide a short circuit from an output of the driver stage to an input of the final stage in the OFF state.

13. The arrangement of claim 12, further a splitter circuit configured to divide the input signal and a combiner circuit configured to combine the peaking amplifier output with the main amplifier output signal.

14. The arrangement of claim 12, wherein the power range is from about zero to a second signal level, wherein the second level is greater than the first signal level.

15. The arrangement of claim 12, wherein the peaking amplifier is configured in an ON state by setting a bias voltage for the peaking amplifier according to the first signal level.

16. The arrangement of claim 12, wherein the interstage matching network is coupled to an output of the driver stage and an input of the final stage.

17. The arrangement of claim 16, wherein the interstage network is configured to provide a short to an input of the final stage when the peaking amplifier is in the OFF state.

18. A method of operating a peaking amplifier comprising:
- identifying a load impedance of a driver stage and a final stage impedance of a final stage;
- configuring an interstage matching network to transform the final stage impedance to match the load impedance of the driver stage when the peaking amplifier is in an ON state;
- configuring the interstage matching network to bias an input signal of the final stage to less than a first signal level when the peaking amplifier is in an OFF state; and
- providing a short circuit from an output of the driver stage to an input of the final stage when the peaking amplifier is in the OFF state.

19. The method of claim 18, further comprising receiving an input signal at an input of the driver stage and providing a peaking amplifier output at the output of the final stage when an amplitude of the input signal at the input of the driver stage is above a first input level.

20. The peaking amplifier of claim 1, wherein the final stage includes a power transistor having a gate, source and drain, wherein the gate is connected to ground when the peaking amplifier is in the OFF state.

* * * * *